(12) United States Patent
Hosmane et al.

(10) Patent No.: US 10,892,094 B2
(45) Date of Patent: Jan. 12, 2021

(54) BORON NITRIDE AND METHOD OF PRODUCING BORON NITRIDE

(71) Applicants: Narayan S. Hosmane, DeKalb, IL (US); Amartya Chakrabarti, Hoffman Estates, IL (US); Shena M. Peter, Rock Island, IL (US)

(72) Inventors: Narayan S. Hosmane, DeKalb, IL (US); Amartya Chakrabarti, Hoffman Estates, IL (US); Shena M. Peter, Rock Island, IL (US)

(73) Assignee: Board of Trustees of Northern Illinois University, DeKalb, IL (US)

( * ) Notice: Subject to any disclaimer, the term of this patent is extended or adjusted under 35 U.S.C. 154(b) by 0 days.

(21) Appl. No.: 16/270,493

(22) Filed: Feb. 7, 2019

(65) Prior Publication Data

US 2019/0244756 A1    Aug. 8, 2019

Related U.S. Application Data

(63) Continuation of application No. 15/100,217, filed as application No. PCT/US2014/066125 on Nov. 18, 2014, now Pat. No. 10,236,122.

(Continued)

(51) Int. Cl.
*C30B 7/10* (2006.01)
*C30B 29/40* (2006.01)
(Continued)

(52) U.S. Cl.
CPC .............. *H01G 4/08* (2013.01); *B82Y 30/00* (2013.01); *C01B 21/0646* (2013.01); *C30B 7/10* (2013.01); *C30B 7/105* (2013.01); *C30B 29/403* (2013.01); *C30B 29/60* (2013.01); *C30B 29/64* (2013.01); *B82Y 40/00* (2013.01);
(Continued)

(58) Field of Classification Search
USPC ...... 361/311, 524, 746; 117/952, 7; 423/290
See application file for complete search history.

(56) References Cited

U.S. PATENT DOCUMENTS 4,913,887 A    4/1990    Sato et al.
6,144,546 A    11/2000   Mizushima et al.
(Continued)

FOREIGN PATENT DOCUMENTS

CN    1597499    3/2005
CN    1955109    5/2007
(Continued)

OTHER PUBLICATIONS

Pakdel, A. et al., "Facile synthesis of vertically aligned hexagonal boron nitride nanosheets hybridized with graphitic domains", Journal of Materials Chemistry, vol. 22, ,pp. 4818-4824, (2012).
(Continued)

*Primary Examiner* — Arun Ramaswamy
(74) *Attorney, Agent, or Firm* — Evan Law Group LLC

(57) ABSTRACT

BN nanosheets are prepared by a method comprising heating to a temperature of at least 500° C., a mixture comprising: (1) an alkali borohydride, and (2) an ammonium salt. $NaN_3$ may be included to increase the yield. No catalyst is required, and the product produced contains less than 0.1 atomic percent metal impurities.

20 Claims, 12 Drawing Sheets

Related U.S. Application Data

(60) Provisional application No. 61/909,912, filed on Nov. 27, 2013.

(51) Int. Cl.
    *C30B 29/60*       (2006.01)
    *C30B 29/64*       (2006.01)
    *C01B 21/064*     (2006.01)
    *H01G 4/08*        (2006.01)
    *B82Y 30/00*       (2011.01)
    *B82Y 40/00*       (2011.01)

(52) U.S. Cl.
    CPC ...... *C01P 2002/72* (2013.01); *C01P 2002/82* (2013.01); *C01P 2004/03* (2013.01); *C01P 2004/04* (2013.01); *C01P 2004/24* (2013.01); *C01P 2006/40* (2013.01); *C01P 2006/80* (2013.01); *Y10S 977/734* (2013.01); *Y10S 977/842* (2013.01)

(56) References Cited

U.S. PATENT DOCUMENTS

| | | | |
|---|---|---|---|
| 7,368,015 | B2 | 5/2008 | D'Evelyn et al. |
| 7,473,853 | B2 | 1/2009 | Mural et al. |
| 8,303,922 | B2 | 11/2012 | Lin et al. |
| 2002/0076557 | A1 | 6/2002 | Fauzi et al. |
| 2011/0027565 | A1* | 2/2011 | Matsumoto ............ C08L 77/00 428/220 |
| 2011/0045223 | A1 | 2/2011 | Lin et al. |
| 2011/0086965 | A1 | 4/2011 | Zhi et al. |

FOREIGN PATENT DOCUMENTS

| | | |
|---|---|---|
| CN | 101913576 | 12/2010 |
| CN | 202558936 | 11/2012 |
| CN | 103043634 | 4/2013 |
| WO | 2012/115348 | 8/2012 |

OTHER PUBLICATIONS

Liu, Z. et al., "Direct growth of graphene/hexagonal boron nitride stacked layers", Nano Letters, vol. 11, pp. 2032-2037, (2011).
Sutter, P. et al., "Interface formation in monolayer graphene-boron nitride heterostructures", Nano Letters, vol. 12, pp. 4869-4874, (2012).
"Nanosheet", Wikipedia, pp. 1-3, found at https://en.wikipedia.org/wiki/Nanosheet , printed on Mar. 21, 2018.
Lee, K.H. et al., "Large-scale synthesis of high-quality hexagonal boron nitride nanosheets for large-area graphene electronics", Nano Letters, vol. 12, pp. 714-718, (2012).
Dean, C.R. et al., "Boron nitride substrates for high-quality graphene electronics", Nature Nanotechnology, vol. 5, pp. 722-726, (2010).
Gannett, W. et al., "Boron nitride substrates for high mobility chemical vapor deposited graphene", Applied Physics Letters, vol. 98, pp. 242105-1-242105-3, (2011).
Taha-Tijerina, J. et al., "Electrically insulating thermal nano-oils using 2D fillers", ACS Nano, vol. 6, No. 2, pp. 1214-1220, (2010).
Li, T-L. et al., "Enhanced thermal conductivity of polyimide films via a hybrid of micro- and nano-sized boron nitride", Journal of Physical Chemistry B, vol. 114, pp. 6825-6829, (2010).
Yu, J. et al., "Vertically aligned boron nitride nanosheets: Chemical vapor synthesis, ultraviolet light emission, and superhydrophobicity", ACS Nano, vol. 4, No. 1, pp. 414-422, (2010).
Sato, K. et al., "Thermally conductive composite films of hexagonal boron nitride and polyimide with affinity-enhanced interfaces", Journal of Materials Chemistry, vol. 20, pp. 2749-2752, (2010).
Harrison, C. et al., "Polyethylene/boron nitride composites for space radiation shielding", Journal of Applied Polymer Science, vol. 109, pp. 2529-2538, (2008).
Wang, J. et al., "Recent advancements in boron nitride nanotubes", Nanoscale, vol. 2, pp. 2028-2034, (2010).
Lin, Y. et al., "Soluble, exfoliated hexagonal boron nitride nanosheets", Journal of Physical Chemistry Letters, vol. 1, pp. 277-283, (2010).
Wang, Y. et al., "Boron nitride nanosheets: large-scale exfoliation in methanesulfonic acid and their composites with polybenzimidazole", Journal of Materials Chemistry, vol. 21, pp. 11371-11377, (2011).
Xue, Y. et al., "Excellent electrical conductivity of the exfoliated and fluorinated hexagonal boron nitride nanosheets", Nanoscale Research Letters, vol. 8, pp. 1-7, (2013).
Cao, G. et al., "Nanostructures & Nanomaterials Synthesis, Properties, and Applications", World Scientific Publishing Co, Chapter 1, pp. 1-17, (2011).
Ismach, A. et al., "Toward the controlled synthesis of hexagonal boron nitride films", ACS Nano, vol. 6, No. 7, pp. 6378-6385, (2012).
Lin, L.X. et al., "Size-dependent oriented attachment in the growth of pure and defect-free hexagonal boron nitride nanocrystals", Nanotechnology, vol. 22, pp. 215603-1-215603-5, (2011).
Pakdel, A. et al., "Nonwetting "white graphene" films", Acta Materialia, vol. 61, pp. 1266-1273, (2013).
Pease, R.S., "An x-ray study of boron nitride", Acta Crystallographica, vol. 5, pp. 356-361, (1952).
Souche, C. et al., "Orientation sensitive EELS-analysis of boron nitride nanometric hollow spheres", Micron, vol. 29, No. 6, pp. 419-424, (1998).
Geick, R. et al., "Normal modes in hexagonal boron nitride", Physical Review, vol. 146, No. 2, pp. 543-547, (1966).
Reich, S. et al., "Resonant raman scattering in cubic and hexagonal boron nitride", Physical Review B, vol. 71, pp. 205201-1-205201-12, (2005).
Li, M. et al., "Thermal-induced shape evolution from uniform triangular to hexagonal r-BN nanoplates", Journal of Materials Chemistry, vol. 19, pp. 8086-8091, (2009).
Watanabe, K. et al., "Direct-bandgap properties and evidence for ultraviolet lasing of hexagonal boron nitride single crystal", Nature Materials, vol. 3, pp. 404-409, (2004).
Lin, L-X. et al., "A simple method to synthesize polyhedral hexagonal boron nitride nanofibers", Solid State Sciences, vol. 9, pp. 1099-1104, (2007).
Sheng, Z-H. et al., "Catalyst-Free Synthesis of Nitrogen-Doped Graphene via Thermal Annealing Graphite Oxide with Melamine and Its Excellent Electrocatalysis", ACS Nano, vol. 5, No. 6, pp. 4350-4358, (2011).
Cattelan, M. et al., "Microscopic view on a chemical vapor deposition route to boron-doped graphene nanostructures", Chemistry of Materials, vol. 25, No. 9, pp. 1490-1495, (2013).
Lin, Y. et al., "Advances in 2d boron nitride nanostructures: nanosheets, nanoribbons, nanomeshes, and hybrids with graphene", Nanoscale, No. 4, issue 22, pp. 6908-6939, (2012).
Palmer, J., ""White graphene" soaks up pollutants and can be re-used", BBC News, Science & Environment, pp. 1-2, found at www.bbc.com/news/science-environment-22351056?print=true, (2013).
Li, J. et al., "Dielectric strength, optical absorption, and deep ultraviolet detectors of hexagonal boron nitride epilayers", Applied Physics Letters, vol. 101, pp. 1-4, (2012).
Stanley, S.M. et al., "Synthesis and characterization of boron nitride nanotubes, nanosheets and heterostructured nanomaterials", Northern Illinois University, ProQuest Dissertations Publishing, pp. 1-105, found at https://search.proquest.com/openview/a64dd4b4fb4ea12e09ec17ddf03a7158/1?pq-origsite=gscholar&cbl=18750&diss=y, (2013).
Hu, J-Q. et al., "Synthesis and characterization of nanocrystalline boron nitride", Journal of Solid State Chemistry, vol. 148, pp. 325-328, (1999).
DeMuth, J.J. et al., "Synthesis and characterization of hexagonal boron nitride nanosheets", Department of Chemistry and Biochemistry, Northern Illinois University, 1 page, Apr. 24, 2013.
Santiago, D. et al., "Hybrid Boron Nitride Nanotubes—Carbon Nanostructures Supercapacitor with High Energy Density", NASA Aeronautics Research Institute, pp. 1-22, (2012).
International Search Report and Written Opinion dated Apr. 13, 2015 for PCT application No. PCT/US14/66125, 13 pages.

(56) References Cited

OTHER PUBLICATIONS

Song, L. et al., "Large scale growth and characterization of atomic hexagonal boron nitride layers", Nano Letters, vol. 10, No. 8, pp. 3209-3215, (2010).
Yao, Y. et al., "Large-scale production of two-dimensional nanosheets", Journal of Materials Chemistry, vol. 22, pp. 13494-13499, (2012).
Gao, R. et al., "High-yield synthesis of boron nitride nanosheets with strong ultraviolet cathodoluminescence emission", The Journal of Physical Chemistry C, vol. 113, No. 34, pp. 15160-15165, (2009).
Sajjad, M. et al., "Large scale synthesis of single-crystal and polycrystalline boron nitride nanosheets", Journal of Materials Science, vol. 48, issue 6, pp. 2543-2549, (2013).
Kim, G. et al., "Growth of high-crystalline, single-layer hexagonal boron nitride on recyclable platinum foil", Nano Letters, vol. 13, No. 4, pp. 1834-1839, (2013).
European Search Report dated Jun. 7, 2017 for European application No. EP 14865172.2, 10 pages.
R1, 7 Pages, Jan. 4, 2018, U.S. Appl. No. 15/100,217, US.
R2, 7 Pages, Jul. 20, 2018, U.S. Appl. No. 15/100,217, US.
R3, 13 Pages, Jul 30, 2018, 201480073807.6, CN.
R4, 9 Pages, Oct. 31, 2018, U.S. Appl. No. 15/100,217, US.
R5, 15 Pages, Mar. 19, 2019, 201480073807.6, CN.

\* cited by examiner

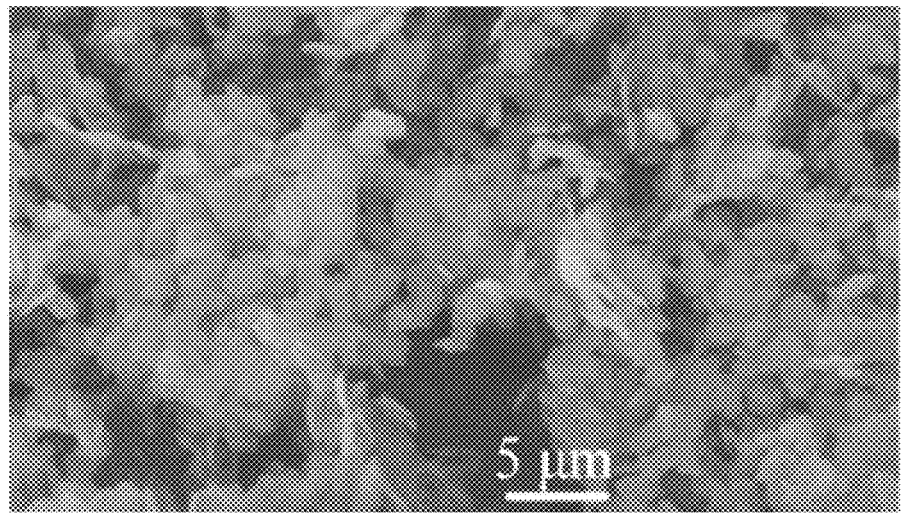
FIG. 1A
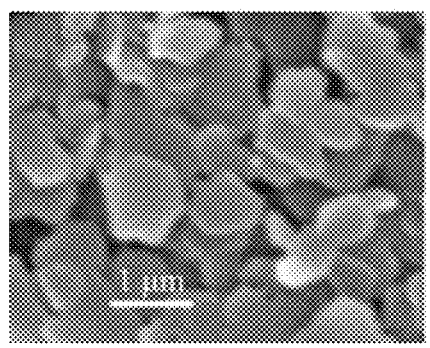 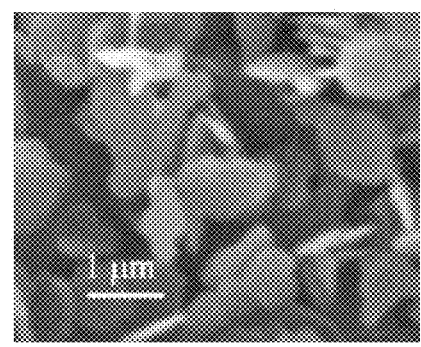
FIG. 1B          FIG. 1C

BORON NITRIDE AND METHOD OF PRODUCING BORON NITRIDE

FEDERALLY SPONSORED RESEARCH OR DEVELOPMENT

This invention was made with government support under CHE-0906179 awarded by the National Science Foundation. The government has certain rights in the invention.

BACKGROUND

Due to structural similarities to graphene, hexagonal boron nitride (h-BN) nanosheets have become an extremely desirable material over the last few years. While many synthetic efforts have been made to combine these two materials for several electronic applications, recently few-layer h-BN nanosheets have been successfully developed as substrates for graphene. Furthermore, h-BN nanosheets are useful in a number of versatile applications due to unique inherent physical properties. h-BN exhibits excellent chemical and mechanical stability and it is thermally conductive and electrically insulating with a wide band gap (5-6 eV) as well. While h-BN is being used as an electrical insulator in thermally conductive materials, composites of h-BN have been the preferred species in aircrafts for their radiation shielding properties.

Although the development of graphene and graphene composites are continuously advancing, few-layer h-BN nanostructures are comparatively less investigated due to synthetic difficulties. Preparation of h-BN nanostructures involves one of the two common approaches, top-down or bottom-up. The top-down process mainly includes mechanical or chemical exfoliation of h-BN nanosheets from bulk h-BN. Although it is one of the most common techniques currently used to produce nanomaterials on a large scale, the major disadvantage of this method is the imperfection of surface structure imparted during the process. On the contrary, the bottom-up approach yields nanostructures with minimal defects and superior chemical homogeneity. Typically, chemical vapor deposition (CVD) is used as a bottom-up approach. However, the requirement of substrate and extreme reaction conditions makes this synthetic route less desirable. Involvement of catalysts in a CVD process not only restricts industrial scaling up of the method, but also yields products with metal impurities.

Recent reports describes the production of defect-free h-BN nanofibers and nanoparticles at 1000 to 1250° C. in a tube furnace (Lin et al., *Solid State Sciences*, 2007, 9, 1099; and Lin et al., *Nanotechnology*, 2011, 22, 215603). These reports describe the preparation of an "intermediate material" containing a "precursor", ammonium chloride ($NH_4Cl$) and potassium chloride (KCl); the intermediate material was prepared by mixing and heating solutions of potassium borohydride ($KBH_4$) and ammonium chloride, followed by distilling off the water. (Although the precursor was isolated by washing the intermediate material with ice water to remove ammonium chloride and potassium chloride, it was not characterized.) The intermediate material was heated under flowing nitrogen at atmospheric pressure to 1000° C. or 1250° C. to form h-BN nanoparticles or nanofibers, respectively. The size of nanoparticles ranged from 30 to 90 nm, while the nanofibers had a diameter of 100 to 500 nm and typically a length greater than 5 μm (5000 nm). No h-BN nanosheets were described.

Consequently, a controlled cost-effective synthetic methodology to prepare boron nitride (BN) nanosheets on a large scale is warranted. There have been no reports to date on a bottom-up methodology that avoids catalysts altogether in producing pristine few-layer BN nanosheets.

SUMMARY

In a first aspect, the present invention is h-BN nanosheets.

In a second aspect, the present invention is the h-BN nanosheets of the first aspect, wherein the h-BN nanosheets are few layer h-BN nanosheets.

In a third aspect, the present invention is the h-BN nanosheets of the second aspect, wherein the h-BN nanosheets have 6 to 20 layers of BN.

In a fourth aspect, present invention is the h-BN nanosheets of any preceding aspects, wherein the h-BN nanosheets contain less than 0.1 atomic percent metal impurities.

In a fifth aspect, the present invention is the h-BN nanosheets of any preceding aspects, wherein the h-BN nanosheets do not contain r-BN, as determined by X-ray powder diffraction.

In a sixth aspect, the present invention is the h-BN nanosheets of any preceding aspects, wherein the h-BN nanosheets have a full width at half maximum (FWHM) of the X-ray powder diffraction pattern for a $d_{002}$ peak of at most 0.50 degrees.

In a seventh aspect, the present invention is the h-BN nanosheets of any preceding aspects, wherein the h-BN nanosheets have a full width at half maximum (FWHM) of the X-ray powder diffraction pattern for a $d_{002}$ peak of at most 0.30 degrees.

In an eighth aspect, the present invention is the h-BN nanosheets of any preceding aspects, wherein the h-BN nanosheets have a full width at half maximum (FWHM) of the X-ray powder diffraction pattern for a $d_{100}$ peak of at most 0.50 degrees.

In a ninth aspect, the present invention is the h-BN nanosheets of any preceding aspects, wherein the h-BN nanosheets have a full width at half maximum (FWHM) of the X-ray powder diffraction pattern for a $d_{100}$ peak of at most 0.25 degrees.

In a tenth aspect, the present invention is the h-BN nanosheets of any preceding aspects, wherein the h-BN nanosheets have a particle size of 250 to 900 nm.

In an eleventh aspect, the present invention is a method of making BN nanosheets, comprising heating to a temperature of at least 500° C., a mixture comprising: (1) an alkali metal borohydride, and (2) an ammonium salt. Preferably, the heating is carried out for at least 12 hours, more preferably 12 to 48 hours.

In a twelfth aspect, the present invention is the method of the eleventh aspect, wherein the alkali metal borohydride comprises $KBH_4$.

In a thirteenth aspect, the present invention is the method of any preceding aspects, wherein the ammonium salt comprises $NH_4Cl$.

In a fourteenth aspect, the present invention is the method of any preceding aspects, wherein the mixture further comprises $NaN_3$.

In a fifteenth aspect, the present invention is the method of any preceding aspects, further comprising washing the product with water and/or acid to remove any byproducts.

In a sixteenth aspect, the present invention is the method of any preceding aspects, wherein the BN nanosheets are h-BN nanosheets.

In a seventeenth aspect, the present invention is the method of any preceding aspects, wherein the BN nanosheets are few layer h-BN nanosheets.

In an eighteenth aspect, the present invention is the method of any preceding aspects, wherein the BN nanosheets have 6 to 20 layers of BN.

In a nineteenth aspect, the present invention is the method of any preceding aspects, wherein the BN nanosheets contain less than 0.1 atomic percent metal impurities.

In a twentieth aspect, the present invention is the method of any preceding aspects, wherein the BN nanosheets do not contain r-BN, as determined by X-ray powder diffraction.

In a twenty-first aspect, the present invention is the method of any preceding aspects, wherein the BN nanosheets have a full width at half maximum (FWHM) of the X-ray powder diffraction pattern for a $d_{002}$ peak of at most 0.50 degrees.

In a twenty-second aspect, the present invention is the method of any preceding aspects, wherein the BN nanosheets have a full width at half maximum (FWHM) of the X-ray powder diffraction pattern for a $d_{002}$ peak of at most 0.30 degrees.

In a twenty-third aspect, the present invention is the method of any preceding aspects, wherein the BN nanosheets have a full width at half maximum (FWHM) of the X-ray powder diffraction pattern for a $d_{100}$ peak of at most 0.50 degrees.

In a twenty-fourth aspect, the present invention is the method of any preceding aspects, wherein the BN nanosheets have a full width at half maximum (FWHM) of the X-ray powder diffraction pattern for a $d_{100}$ peak of at most 0.25 degrees.

In a twenty-fifth aspect, the present invention is the method of any preceding aspects, wherein the heating is carried out in a sealed container.

In a twenty-sixth aspect, the present invention is the method of any preceding aspects, wherein the heating is carried out at a temperature of at least 600° C.

In a twenty-seventh aspect, the present invention is the method of any preceding aspects, wherein the heating is carried out at a temperature of at least 700° C.

In a twenty-eighth aspect, the present invention is the method of any preceding aspects, wherein the heating is carried out at a temperature of at least 800° C.

In a twenty-ninth aspect, the present invention is the method of any preceding aspects, wherein the heating is carried out for at least 24 hours.

In a thirtieth aspect, the present invention is the method of any preceding aspects, wherein the heating is carried out for at least 48 hours.

In a thirty-first aspect, the present invention is a capacitor, comprising (a) a substrate, (b) a first conductive layer, on the substrate (c) an insulating layer, on the conductive layer, and (d) a second conductive layer, on the insulating layer. The insulating layer comprises BN nanosheets.

In a thirty-second aspect, the present invention is the capacitor of thirty-first aspect, wherein the BN nanosheets are few layer h-BN nanosheets.

In a thirty-third aspect, the present invention is the capacitor of any of the preceding aspects, wherein the BN nanosheets have 6 to 20 layers of BN.

In a thirty-fourth aspect, the present invention is the capacitor of any of the preceding aspects, wherein the BN nanosheets contain less than 0.1 atomic percent metal impurities.

In a thirty-fifth aspect, the present invention is the capacitor of any of the preceding aspects, wherein the BN nanosheets do not contain r-BN, as determined by X-ray powder diffraction.

In a thirty-sixth aspect, the present invention is the capacitor of any of the preceding aspects, wherein the BN nanosheets have a full width at half maximum (FWHM) of the X-ray powder diffraction pattern for a $d_{002}$ peak of at most 0.50 degrees.

In a thirty-seventh aspect, the present invention is the capacitor of any of the preceding aspects, wherein the BN nanosheets have a full width at half maximum (FWHM) of the X-ray powder diffraction pattern for a $d_{002}$ peak of at most 0.30 degrees.

In a thirty-eighth aspect, the present invention is the capacitor of any of the preceding aspects, wherein the BN nanosheets have a full width at half maximum (FWHM) of the X-ray powder diffraction pattern for a $d_{100}$ peak of at most 0.50 degrees.

In a thirty-ninth aspect, the present invention is the capacitor of any of the preceding aspects, wherein the BN nanosheets have a full width at half maximum (FWHM) of the X-ray powder diffraction pattern for a $d_{100}$ peak of at most 0.25 degrees.

In a fortieth aspect, the present invention is BN nanosheets, prepared by the method of any one of the eleventh through thirtieth aspects.

DEFINITIONS

The term "nanomaterial" means a particle with one or more axes of 100 nanometers (nm) or less. The term "nanomaterial" includes nanospheres, nanorods, nanoplates, nanofibers, and nanosheets. The size of an axis is the size as determined by electron microscopy.

The term "particle size" means the largest axis of the particle, and "average particle size" is the average of the particle size of a collection of particles.

The term "nanosphere" means a nanomaterial having an aspect ratio of at most 3:1.

The term "nanorod" or "nanoplate" means a nanomaterial having an aspect ratio of greater than 3:1 to less than 10:1.

The term "nanofiber" means a nanomaterial having an aspect ratio of at least 20:1, a longest axis greater than 2 μm (2000 nm), and the ratio of the length to width of a cross-section perpendicular to the longest axis being at most 10:1.

The term "nanosheet" means a nanomaterial having an aspect ratio of at least 10:1, which is not a nanofiber. Preferably, the ratio of the length to width of a cross-section perpendicular to the shortest axis is at most 10:1. Preferably, a longest axis is at most 2 μm (2000 nm).

The term "aspect ratio" means the ratio of the longest axis of an object to the shortest axis of the object, where the axes are not necessarily perpendicular.

"h-BN" means boron nitride with a hexagonal structure, as determined by X-ray diffraction. "r-BN" means boron nitride with a rhombohedra structure, as determined by X-ray diffraction. The relative amounts of h-BN and r-BN in a sample are the amounts as determined by X-ray powder diffraction.

The term "few layer" refers to a nanomaterial of boron nitride having up to 50 layers, or a thickness perpendicular to the layers of at most 20 nm (each layer having a thickness of about 0.33 nm/layer), as determined by electron microscopy.

The term "metal impurities" means the amount of all metals impurities (for example magnesium, aluminum, silicon, nickel, chromium and iron) in a boron nitride sample, as determined by energy-dispersive X-ray spectroscopy (EDX).

Yield of BN is based on the starting moles of boron (as borohydride) used in the starting materials.

BRIEF DESCRIPTION OF THE DRAWINGS

FIG. 1A is an SEM image of BNS12 showing uniform product morphology. Nanosheets having an average diameter of 600 nm were observed with a narrow size distribution.

FIG. 1B is an SEM image of BNS12 showing uniform product morphology.

FIG. 1C is an SEM image of BNS12 showing uniform product morphology.

DETAILED DESCRIPTION

Figure 2A:
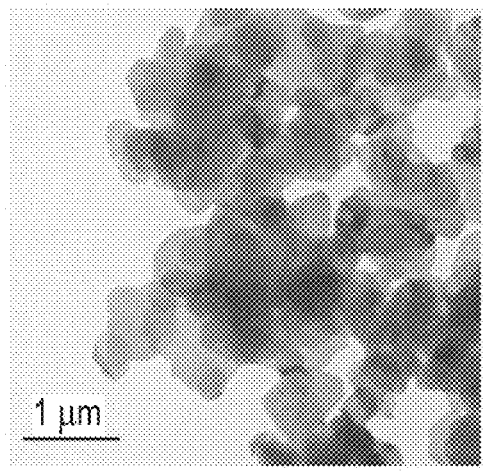
FIG. 2A is a TEM image of BNS12 exhibiting a narrow size distribution.

The present invention makes use of the discovery of a simple and inexpensive method of synthesizing BN, including BN nanosheets such as h-BN nanosheets and mixtures of h-BN nanosheets and r-BN nanosheets. The process avoids the need for metal catalysts, and therefore the product is not contaminated with metals from the catalyst. The product has excellent crystallinity, and a narrow distribution of particles size. By controlling the reaction time and temperature, particle size and the number of layers can be controlled, as well as the proportion of h-BN nanosheets and r-BN nanosheets in the product.

The reaction starting materials include a borohydride, such as an alkali metal borohydrides (for example $NaBH_4$, $KBH_4$ or $RbBH_4$, and mixtures thereof), and an ammonium compound, such as an ammonium salt, (for example $NH_4Cl$, $NH_4Br$ or $NH_4I$, and mixtures thereof). Optionally, an azide, such as $NaN_3$ or $KN_3$ may be included. The reaction is preferably carried out in a closed system, such as a stainless steel reactor or autoclave. Preferably, the molar ratio of borohydride to ammonium compound is 1:1; when an azide is included, it is also preferably present in an equimolar amount to the borohydride.

reaction is carried out at a temperature of at least 500° C., and preferably for a time of at least 12 hours. An increase in temperature or time of the reaction will increase the particle size and the number of layers in the BN product; at the highest temperatures, an increase of reaction time will have little effect on particle size, but will increase the number of layers. Preferably, the reaction is carried out at a temperature of at least 600° C., more preferably at least 700° C., and most preferably at a temperature of at least 800° C., for example 600 to 800° C. Preferably, the reaction is carried out for at least 12 hours, or at least 24 hours, or at least 48 hours, such as 12 to 48 hours.

After the reaction is completed, the product may be washed with water and/or acid to remove byproducts, such as KCl. The yield also increases with increasing temperature; preferably the yield is at least 70%, more preferably at least 80%. Increasing reaction time and temperature will also increase the proportion of h-BN nanosheets produced while reducing the proportion of r-BN nanosheets produced, allowing for the preparation of single phase h-BN nanosheets at a temperature of about 600° C. or greater.

The product produced will preferably have at most 25 layers, such as 6 to 22 layers, of BN in each nanosheet. The BN produced is highly crystalline, and preferably the h-BN produced will have a full width at half maximum (FWHM) of the X-ray powder diffraction for the $d_{002}$ peak of at most 0.50, more preferably at most 0.46 or 0.42, and most preferably at most 0.30, degrees. Preferably the h-BN produced will have a FWHM of the X-ray powder diffraction for the $d_{100}$ peak of at most 0.50, more preferably at most 0.41 or 0.33, and most preferably at most 0.25, degrees.

No catalyst is used in the preparation of the BN, thus producing a high purity product. Preferably, the amount of metal impurities is less than 0.1 atomic percent, such as the amount of magnesium, aluminum, silicon, nickel, chromium and/or iron.

BN has a variety of uses. BN may be used as a high-temperature lubricant. BN is also useful has a thermal conductor, particularly in high-temperature applications. BN typically contains about 10% $B^{10}$, and is effective as a neutron shielding or neutron absorbing material. h-BN nanosheets are also useful as a substrate for the growth of graphene, for example by CVD or other chemical deposition methods of forming graphene. With a particle size of less than 100 nm, h-BN nanosheets may also be used in pharmaceutical applications, such as a carrier particle for delivery of a drug (for example, an organic chemical, protein or oligonucleotide). Because BN is an insulator, it may also be used to form field effect transistors (FET), or as a dielectric material in a capacitor.

Figure 11A:
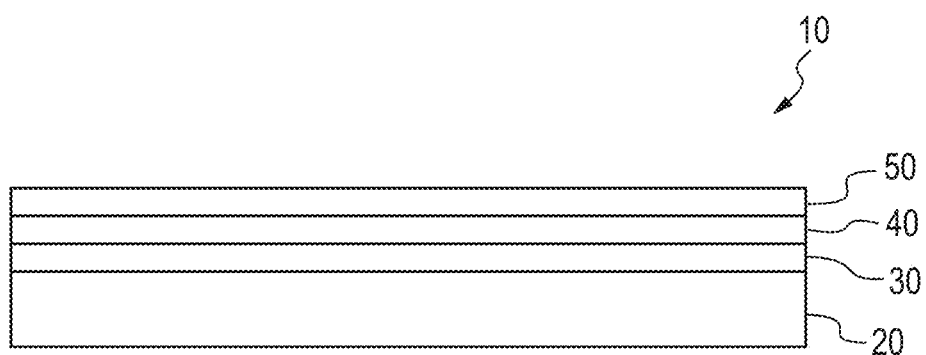
FIG. 11A illustrates a capacitor.
Figure 11B:
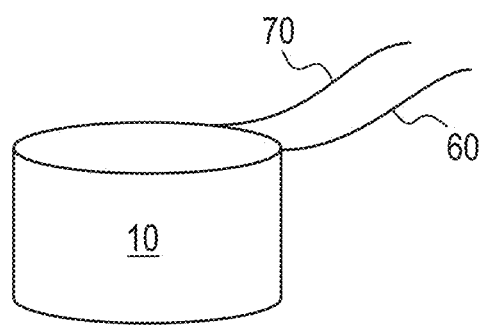
FIG. 11B illustrates a capacitor.

An example of a capacitor is illustrated in FIG. 11(a) and FIG. 11(b). FIG. 11(a) illustrates the structure of the capacitor 10: a substrate 20, such as a metal foil or a plastic film; a first layer of conductor 30, such as a layer of graphene or carbon nanotubes, on the substrate; a layer of insulator 40, such as a layer of BN nanosheets (for example h-BN nanosheets), on the layer of conductor; and a second layer of conductor 50, such as a layer of graphene or carbon nanotubes, on the layer of insulator. The structure may then be rolled up into a cylinder, as illustrated in FIG. 11(b), where the capacitor 10 has a cylinder shape, and an optional first lead 60 is electrically connected to the first layer of conductor, and an optional second lead 70 is electrically connected to the second layer of conductor. Such a structure may be formed by forming a slurry of graphene or carbon nanotubes, to form a conductive ink, and similarly a slurry of BN nanosheets, to form a BN nanosheet ink which is otherwise identical to the conductive ink except for the substitution of the BN nanosheets for the graphene or carbon nanotubes. The conductive ink may then be painted onto the substrate. Once dried or cured, the BN nanosheet ink may be painted onto the conductive layer. Once the BN nanosheet ink is dried or cured, a layer of the conductive ink may be pained onto the insulating layer. After all layers are dried or cured, the leads may be attached to the respective layers, and the structure rolled up into a cylinder to form the capacitor.

EXAMPLES

Example 1: h-BN nanosheets

Reported here is a bottom-up synthesis for few-layer h-BN nanosheets by an autoclave pyrolysis technique. The synthetic methodology involved mixing of $NH_4Cl$, $NaN_3$ and $KBH_4$ in equimolar proportions, in an inert atmosphere. The resulting mixture was heated at 800° C., inside a tightly closed stainless steel autoclave to produce h-BN nanosheets. The time of the reactions was varied from 12 to 48 hours in order to optimize the reaction conditions and to analyze the time-dependency on the morphology of the product. Detailed reaction protocols are described below. The resulting h-BN nanosheets, identified as BNS12, BNS24 and BNS48, were isolated as products from 12 hours, 24 hours and 48 hours reactions, respectively. The products were vacuum dried overnight for further characterization. Scanning electron microscopy (SEM), transmission and high resolution transmission electron microscopy (TEM and HRTEM), energy-dispersive X-ray spectroscopy (EDX), electron energy loss spectroscopy (EELS), Fourier transform infrared (FT-IR) spectroscopy, Raman spectroscopy, X-ray powder diffraction (XRD), and UV-Visible spectroscopy are the techniques used for characterizing the product.

Although this innovative technique produced few-layer h-BN nanosheets with high yield in a stainless steel autoclave, the exact mechanism of this process is unknown. One possible explanation is that the high pressure generated during the pyrolysis facilitated the formation of few-layer nanosheets of h-BN. The advantages of this methodology over the CVD methods are manifold. While almost all of the CVD techniques require temperatures higher than 1000° C., a comparatively lower temperature, used in this synthesis, is noteworthy. In addition, the catalyst-free synthetic approach involving inexpensive starting material without the continuous stream of gas made this process unique, cost-effective and ideal for large-scale production. Nonetheless, the method is simple enough in that the rigorous purification techniques can be avoided and the products can be washed with acid and deionized water to produce pristine product. The yield of the products, though in slight deviation (less than 4%), was calculated for each reaction (Table 1).

TABLE 1

Synthesis and electrical property of h-BN nanosheets

| Sample | Reaction Conditions | Yield (%) | Band gap[a] (eV) |
|---|---|---|---|
| BNS12 | 800° C., 12 hrs | 83 | 5.980 |
| BNS24 | 800° C., 24 hrs | 85 | 6.018 |
| BNS48 | 800° C., 48 hrs | 87 | 6.048 |

[a]Band gaps are calculated from the UV-visible spectroscopic data.

The morphology of the BN nanosheets samples was investigated using SEM (TeScan Vega II SBH). The products were lightly coated with gold for the ease of imaging purposes. The images exhibit uniform product dimensions (FIG. 1a-c) and the average diameter of the nanosheets was found to be approximately 600 nm. A narrow size distribution of the products was observed for all of the samples at different time periods. Thus, the size of the product is independent of the reaction times.

Figure 2B:
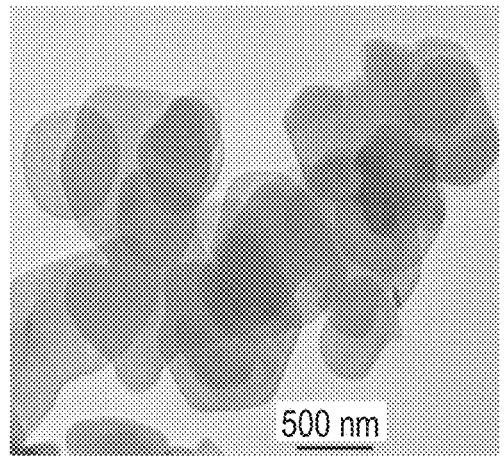
FIG. 2B is a TEM image of few-layer BN nanosheets (BNS48).
Figure 2C:
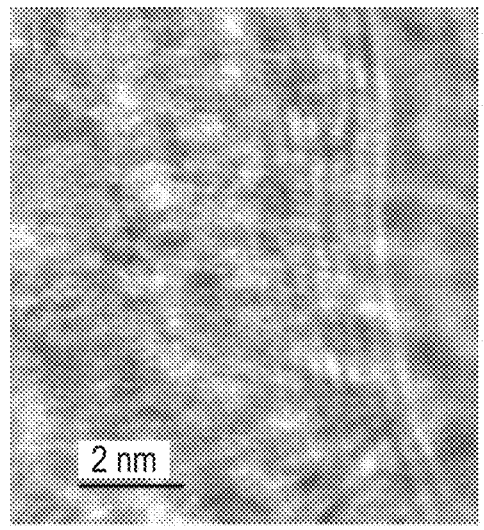
FIG. 2C is a HRTEM image of BNS12 showing 6 layers.
Figure 2D:
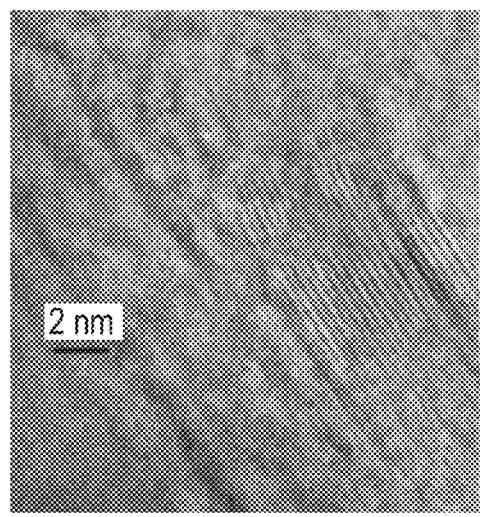
FIG. 2D is a HRTEM image of BNS48 showing 20 layers. Interlayer distance was determined to be 0.33 nm.

TEM (Hitachi H-600) characterization is consistent with the findings from SEM imaging for all of the samples with product dimension falling under similar data ranges (FIGS. 2a & 2b). On the other hand, the HRTEM (JEOL JEM-2100F) determined the number of layers of the h-BN nanosheets. While, BNS12 exhibited nanosheets with an average of 6-8 layers (FIG. 2c) BNS24 and BNS48 showed varied number of layers between 20 and 22 (FIG. 2d). The spacing between the layers was estimated by measuring the thickness of the sheet and dividing it by the number of layers. The resulting value of 0.33 nm matches perfectly with the previously published data as well as those collected via XRD studies. Nonetheless, the HRTEM images evidently predicted that the reaction time has a pronounced effect on the formation of h-BN layers. A controlled reaction time can reduce the number of layers without significantly changing the reaction yields.

Figure 3A:
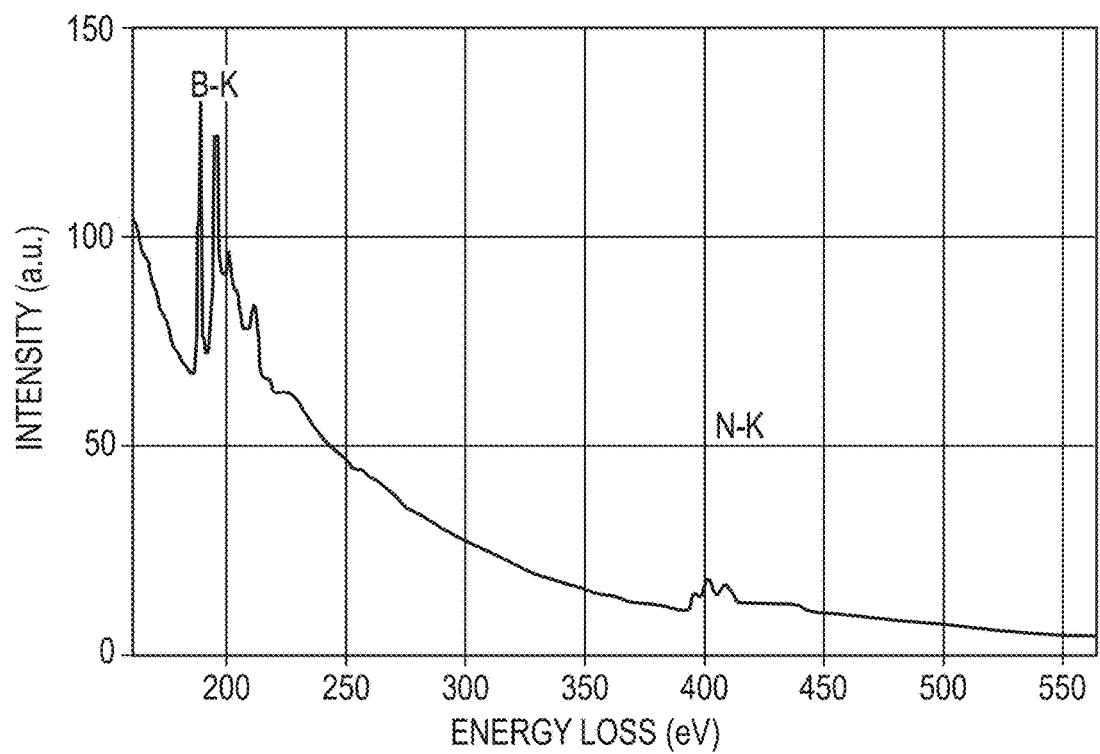
FIG. 3A is an EEL spectra of BNS12 sample.
Figure 3B:
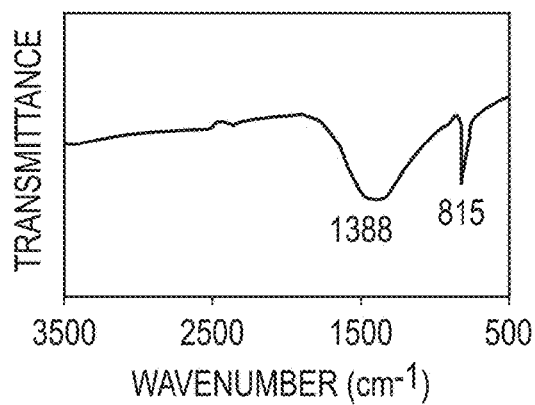
FIG. 3B is a FT-IR spectra of BNS12 sample.

While the EDX spectra was generated over a large area of the products using an INCAx-act Analytical Standard EDS Detector, EELS data was obtained via an electron energy loss detector attached to the JEOL JEM-2100F microscope. FIG. 3a depicts the EEL spectrum of BNS12 and EDX spectra of all BN nanosheet samples are provided in FIGS. 6a-c. Both the EELS and EDX data ascertains the elemental composition and purity of h-BN nanosheets. The atomic ratio of B:N was found to be 1:1 (atomic weight percentage of B:N=50.06:49.94) by EDX analysis. The peak positions and the splitting patterns in EEL spectrum confirms the sp2 hybridization of BN in h-BN nanosheets. The energy loss around 190 eV and 400 eV corresponded to the K-shell ionization energy of the B and N atoms, respectively.

Figure 3C:
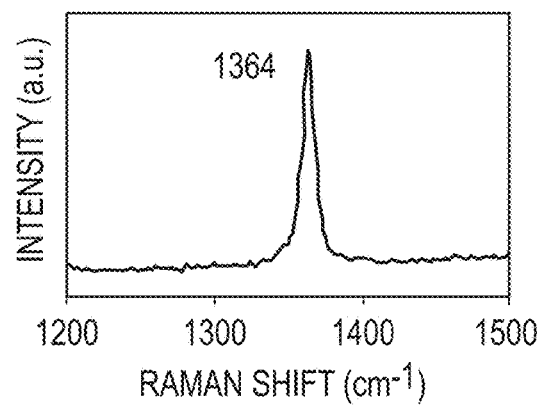
FIG. 3C is a Raman spectra of BNS12 sample.

Bonding patterns of the B and N atoms in nanosheets and purity of the products were further verified by FT-IR (ATI Mattson Genesis series) and Raman spectroscopy (FIGS. 3c & 3d). The FT-IR peak at 1388 cm$^{-1}$ is due to the stretching vibration of B-N bonds. A comparatively weaker peak at 815 cm$^{-1}$ can be attributed to the bending vibration of B-N-B bonds of h-BN. Raman spectroscopy of the BN nanosheet samples was performed using a Renishaw inVia Raman microscope with a 532 nm laser source. An intense sharp peak at 1364 cm$^{-1}$ acts as the definite confirmation of the presence of h-BN in the sample.

Figure 4:
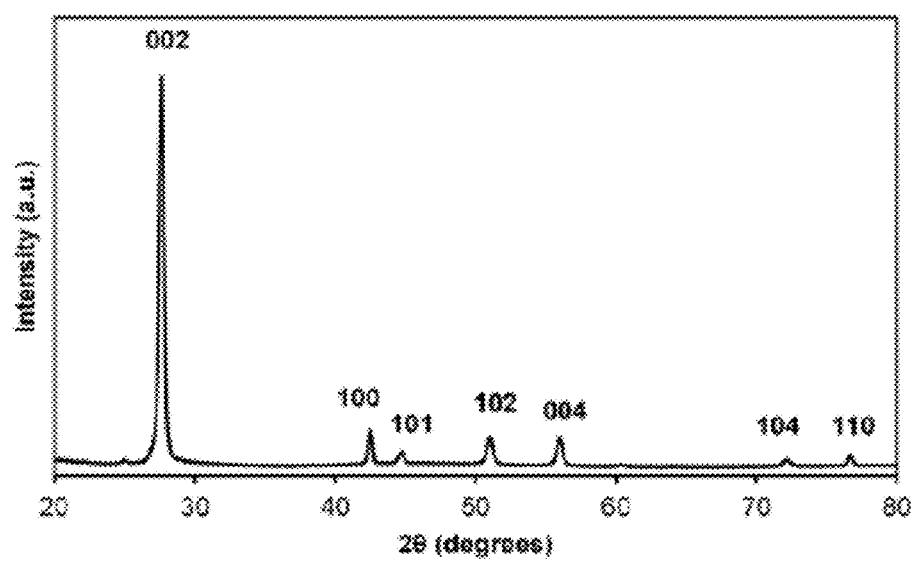
FIG. 4 is an XRD pattern of BNS12. The product synthesized at 800° C. for 12 hours was indexed as $d_{002}=3.225$ (27.64°), $d_{100}=2.127$ (42.47°), $d_{101}=2.026$ (44.71°), $d_{102}=1.789$ (50.98°), $d_4=1.642$ (55.94°), $d_{104}=1.308$ (72.12°), $d_{110}=1.241$ (76.68°).
Figure 5A:
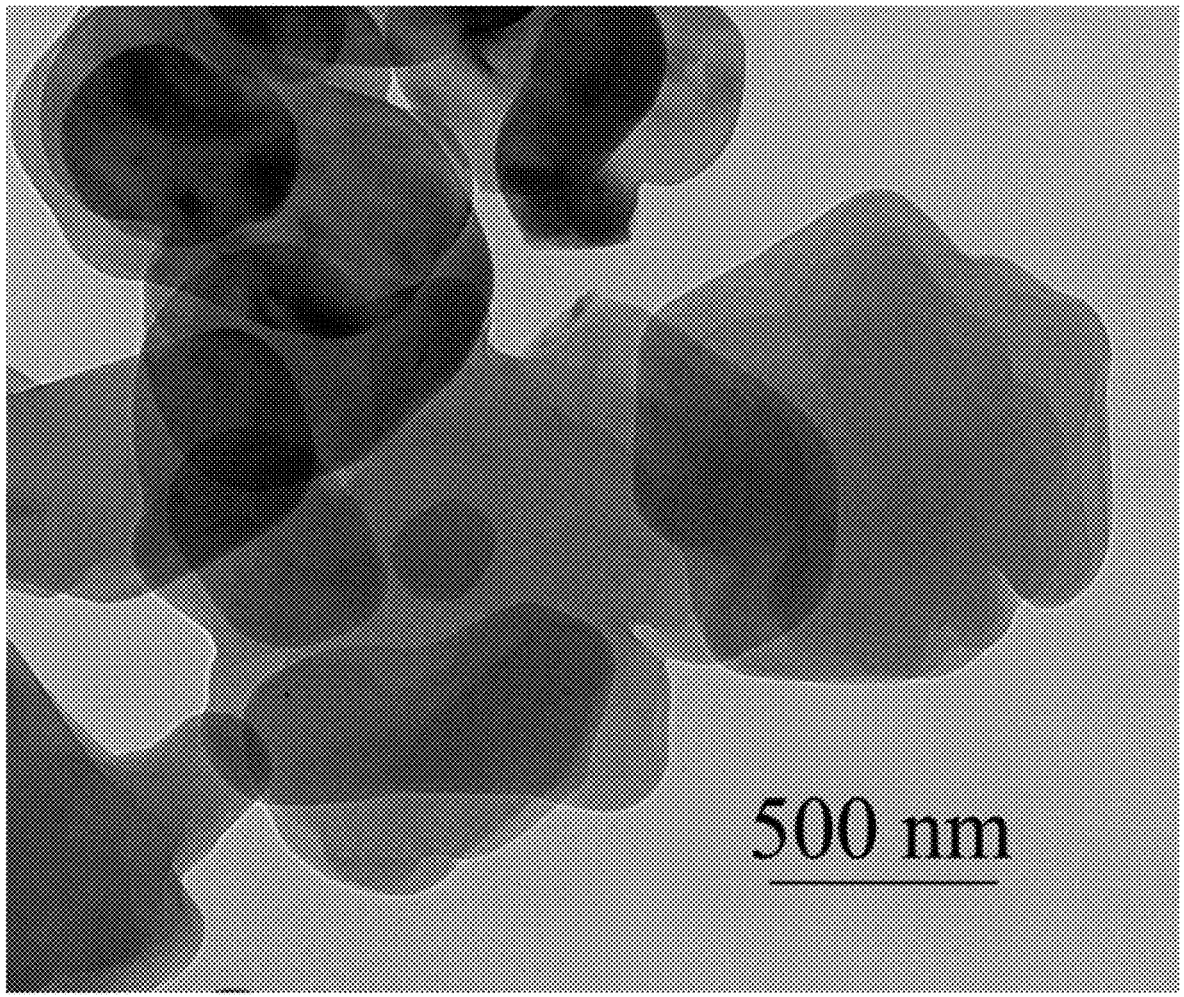
FIG. 5A is a TEM image of BNS24.
Figure 5B:
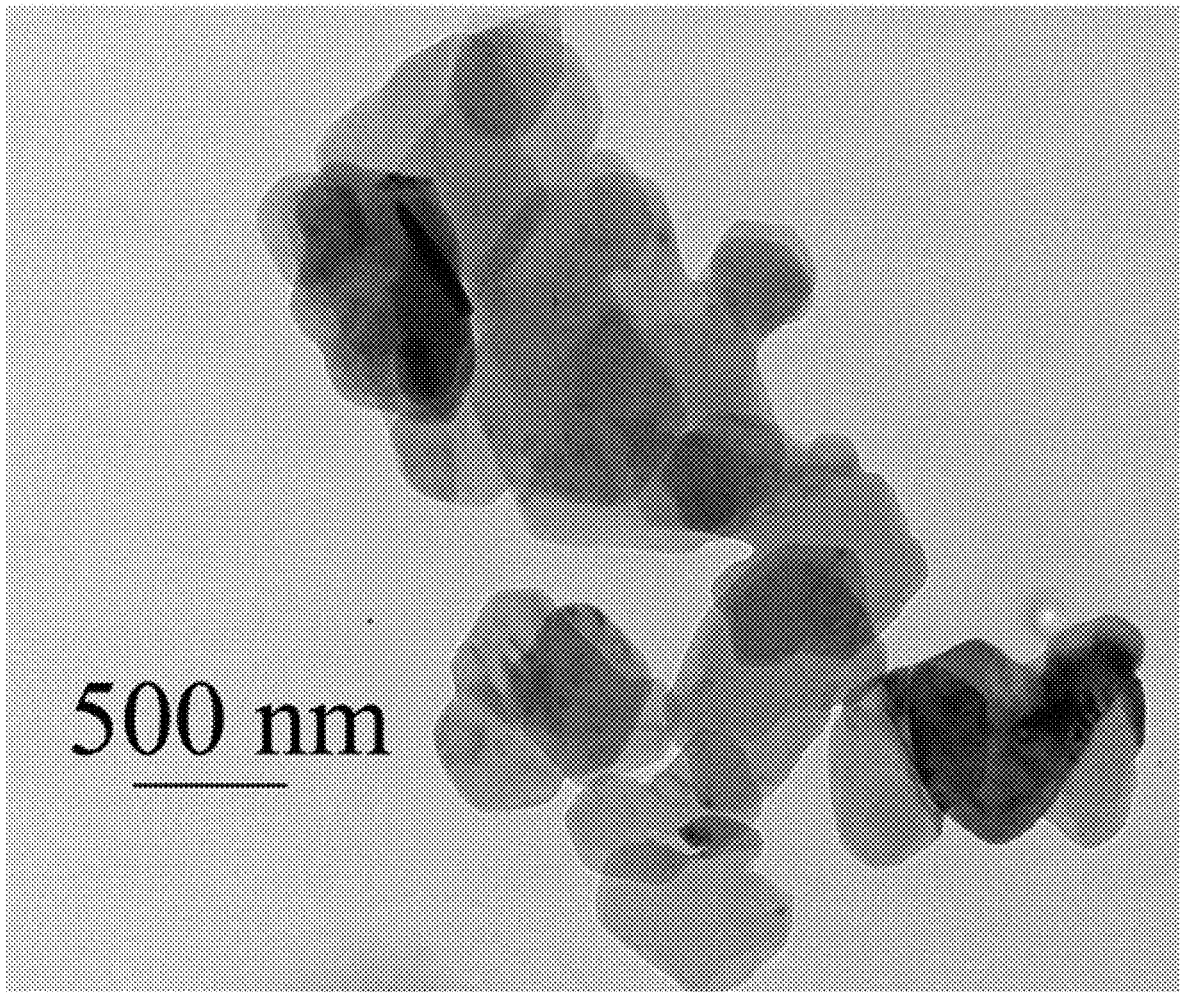
FIG. 5B is a TEM image of BNS48. Both materials have a good parity with the dimension of the nanosheets (average particle diameters of 960 nm and 1080 nm, respectively).

The XRD (Rigaku MiniFlex, Cu, 30 kV, 15 mA X-ray) of the h-BN nanosheets, synthesized at 800° C., exhibited interplanar d-spacings and intensities that are indicative of h-BN crystallinity. FIG. 4 shows the spectrum of BNS12 where the indexed peaks are in good agreement with the theoretical values for h-BN (JCPDS 34-0421). The lattice constant of a=2.508 and c=6.667 were calculated using EdPCR component of FullProf Suite software. Additional XRD patterns are included in FIG. 10. Nonetheless, all of the XRD patterns suggest formation of highly ordered and pure h-BN nanosheets.

In conclusion, a novel methodology to prepare few-layer h-BN nanosheets in high yields with acceptable purity has been developed. A 12 hour reaction involving inexpensive starting reagents at moderately low temperature produced nanosheets of uniform dimension and few layers. While the morphology and crystallinity of the product was thoroughly characterized, elemental composition of the products was also determined.

Synthesis of BNS12, BNS24 and BNS48

General methodology and purification

Most common chemicals were obtained from Sigma-Aldrich. The reagents used were KBH$_4$ (99.998%), NH$_4$Cl (99.998%), and NaN$_3$ (99.5%). The HCl used for purification was obtained from Fisher Scientific. In a typical pyrolysis experiment, the reagents were assembled in an argon filled glovebox that contained <2.00 ppm O$_2$. The B and N-containing precursors, KBH$_4$ (4.44 g, 82.31 mmol), NH$_4$Cl (4.41 g, 82.45 mmol) and NaN$_3$ (5.37 g, 82.60 mmol), were thoroughly mixed together and transferred into a 100 mL capacity autoclave that was sealed and then heated to various temperatures from 500° C. to 800° C. for various reaction times of 12 to 48 hours (12 hours for BNS12, 24 hours for BNS24, and 48 hours for BNS48) at 800° C. in a vertical furnace. After completing the reaction, the crude product from the autoclave was transferred to another vessel and washed three times with 3M HCl with sonication between each wash. The next step involved washing with deionized water until the pH of the decanted liquid became neutral. Sonication was carried out between each washing with water. The material was then washed with acetone and dried under high vacuum at room temperature overnight.

Characterization

FIGS. 5-10 show TEM images, EDX spectra, FTIR spectra, Raman spectra, UV-visible spectra and X-ray diffraction patterns of the BNS12, BNS24 and BNS48.

Figure 6A:
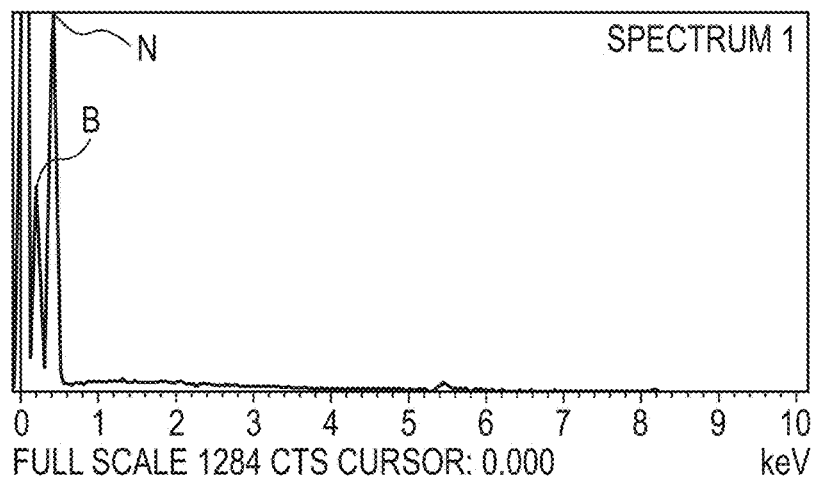
FIG. 6A is an EDX spectra of BNS12 (atomic ratio of B:N=50.06:49.94). No metal impurities were found in either of the samples.
Figure 6B:
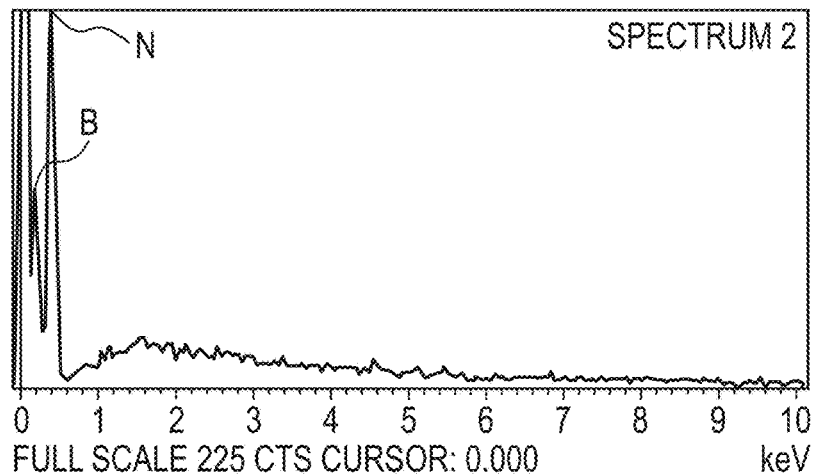
FIG. 6B is an EDX spectra of BNS24 (atomic ratio of B:N=49.9:50.10).
Figure 6C:
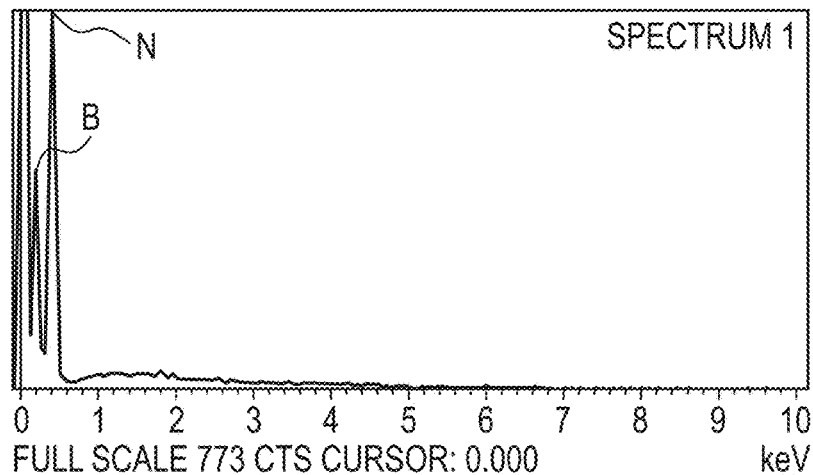
FIG. 6C is an EDX spectra of BNS48 (atomic ratio of B:N=49.66:50.34).
Figure 7A:
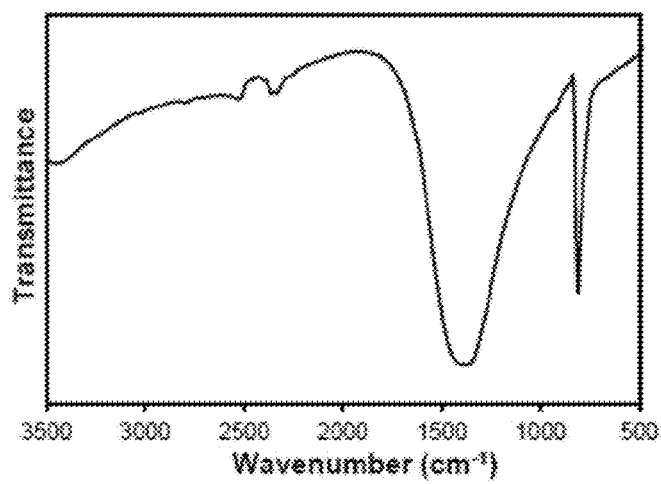
FIG. 7A is a FT-IR spectra of BNS24 peaks at 1386 $cm^{-1}$ and 812 $cm^{-1}$.
Figure 7B:
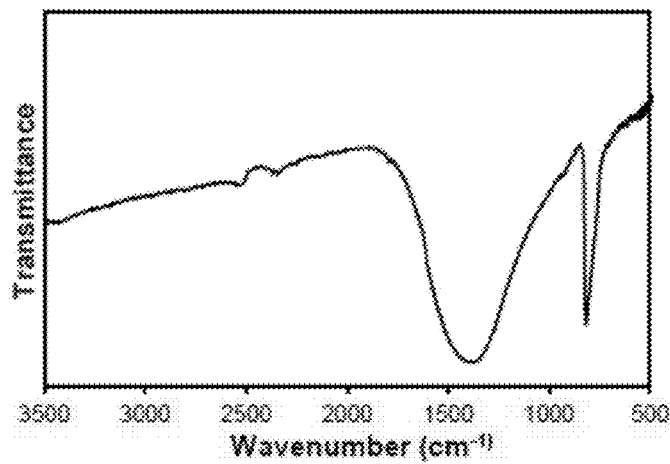
FIG. 7B is a FT-IR spectra of BNS48, peaks for h-BN at 1388 and 815 $cm^{-1}$.
Figure 8A:
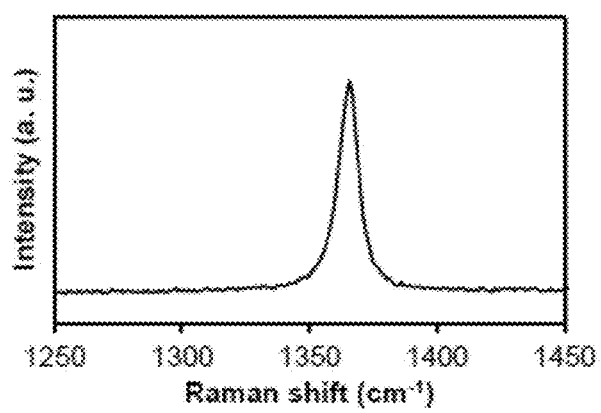
FIG. 8A is Raman Spectra of BNS24.
Figure 8B:
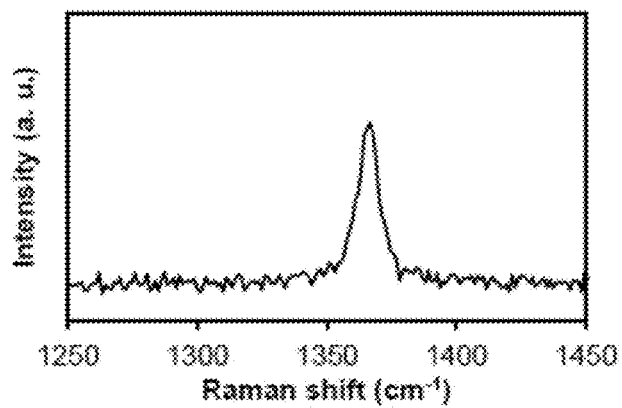
FIG. 8B is Raman Spectra of BNS48. The spectra exhibit the Raman shift for h-BN at 1364 $cm^{-1}$ for BNS24 and 1366 $cm^{-1}$ for BNS48 respectively.
Figure 9A:
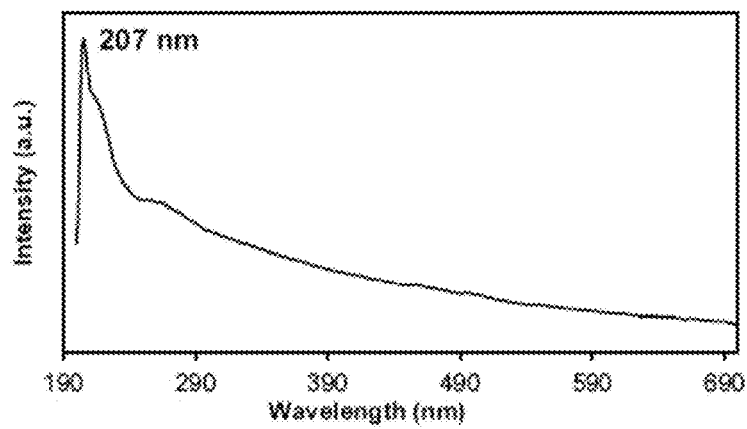
FIG. 9A is UV-visible spectra of BNS12 with a band gap of 5.98 eV.
Figure 9B:
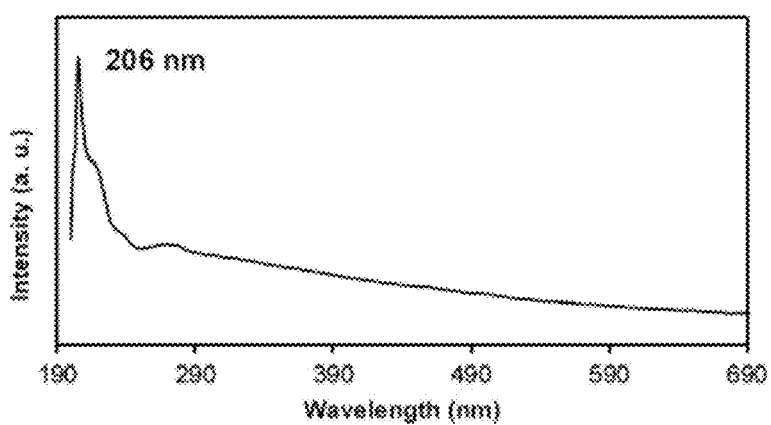
FIG. 9B is UV-visible spectra of BNS24 showing the absorption band at 6.018 eV.
Figure 9C:
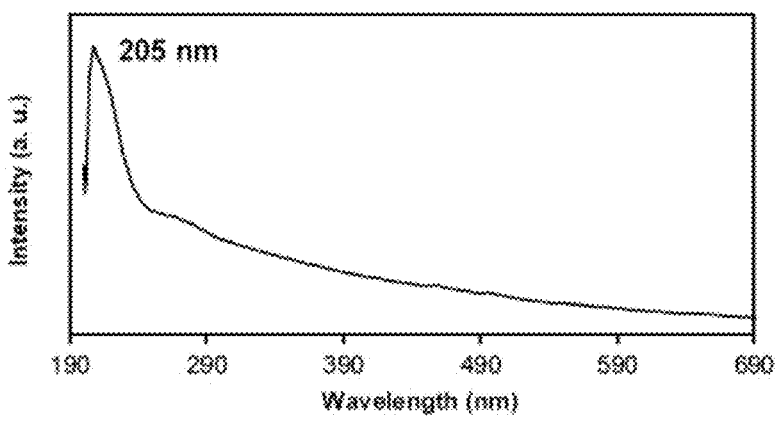
FIG. 9C is UV-visible spectra of BNS48 exhibiting band gap of 6.048 eV.

Analysis of FIGS. 6(a), 6(b) and 6(c) indicate a purity (B:N) for BNS12, BNS24 and BNS48, of 43.47:56.53 wt. % (49.90:50.10 atomic %), 43.23:56.77 wt. % (49.66:50.34 atomic %), and 43.62:56.38 wt. % (50.06:49.94 atomic %), respectively. The level of metal impurities in all the samples was less than 0.1 atomic %.

Figure 10A:
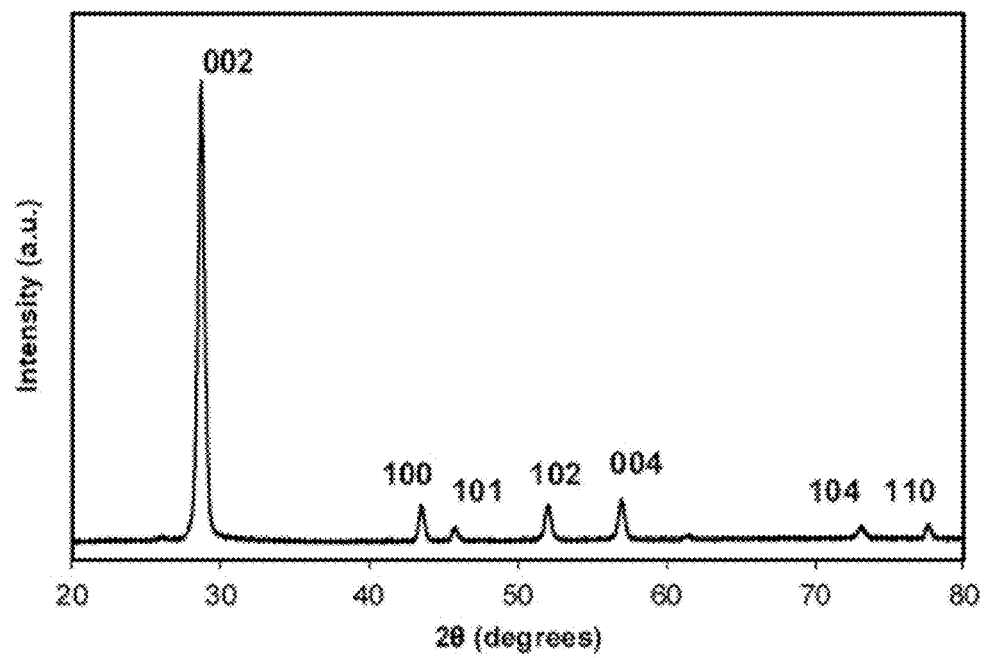
FIG. 10A is an X-ray diffraction pattern of BNS24, the product is indexed as $d_{002}=3.106$ (28.72°), $d_{100}=2.077$ (43.51°), $d_{101}=1.947$ (45.73°), $d_{102}=1.755$ (52.05°), $d_{004}=1.615$ (56.98°), $d_{104}=1.294$ (73.14°), $d_{110}=1.229$ (77.68°).
Figure 10B:
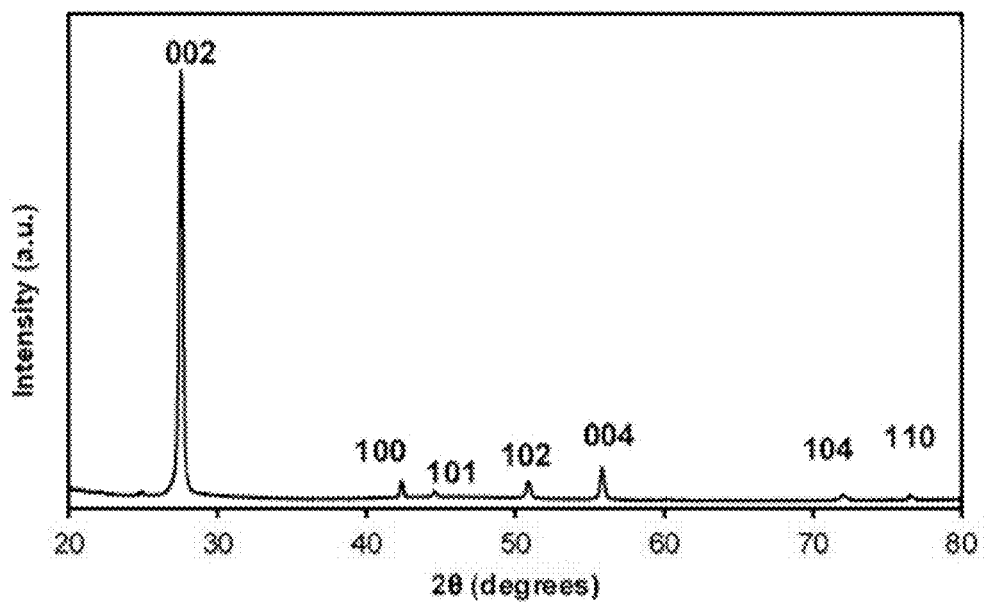
FIG. 10B is an X-ray diffraction pattern of BNS48, the product is indexed as $d_{002}=3.239$ (27.52°), $d_{100}=2.132$ (42.34°), $d_{101}=2.031$ (44.58°), $d_{102}=1.792$ (50.87°), $d_{004}=1.645$ (55.83°), $d_{104}=1.310$ (72.01°), $d_{110}=1.245$ (76.53°).

FIGS. 4, 10(a) and 10(b), show the X-ray diffraction patters of BNS12, BNS24 and BNS48, respectively. The full width at half maximum of the d$_{002}$ diffraction peaks were 0.42°, 0.46°, and 0.28°, for BNS12, BNS24 and BNS48 respectively. The full width at half maximum of the d$_{100}$ diffraction peaks were 0.33°, 0.41°, and 0.22°, for BNS12, BNS24 and BNS48 respectively. This demonstrates the highly crystalline nature of the h-BN product produced.

Example 2: mixed phase r-BN/h-BN and pure h-BN

Experimental

The experimental details for Example 2 were the same as for Example 1, except that the temperatures used with the samples varied from 500° C. to 800° C. for various reaction times of 12 to 48 hours, as indicated in Table 2.

TABLE 2

Synthesis and yields of BN nanosheet reactions

| Sample | Reaction conditions | | Yield (%) | Phase |
|---|---|---|---|---|
| 1 | 500° C. | 12 hrs | 40 | r-BN, h-BN |
| 2 | | 24 hrs | 67 | r-BN, h-BN |
| 3 | | 48 hrs | 83 | r-BN, h-BN |
| 4 | 600° C. | 12 hrs | 66 | r-BN, h-BN |
| 5 | | 24 hrs | 69 | r-BN, h-BN |
| 6 | | 48 hrs | 90 | h-BN |
| 7 | 700° C. | 12 hrs | 87 | r-BN, h-BN |
| 8 | | 24 his | 88 | h-BN |
| 9 | | 48 hrs | 78 | h-BN |
| 10[a] | 800° C. | 12 hrs | 83 | h-BN |
| 11[b] | | 24 hrs | 85 | h-BN |
| 12[c] | | 48 his | 87 | h-BN |

[a]Corresponds to sample BNS12 from Example 1.
[b]Corresponds to sample BNS24 from Example 1.
[c]Corresponds to sample BNS48 from Example 1.

The threshold temperature for the formation of BN was found to be 500° C. The first appearance of predominant h-BN crystal lattice was in sample 6, for which the reaction temperature was 600° C. over a period of 48 hours. Samples 10-12 showed high purity and excellent h-BN crystallinity. The yield of the products, with slight deviation, was calculated for each reaction and was determined based on the use of KBH$_4$. In addition, it is important to note that sample 6 resulted in a 90% yield which translates into over 1.8 g of the pure white product.

In addition to the temperature and time-dependent study, the role of the chemical precursors in the synthesis was also examined. It was found that the absence of NaN$_3$ in the precursor mixture reduced the yield to less than 40% when equimolar quantities of KBH$_4$ and NH$_4$Cl were reacted at 800° C. for 48 hours (Table 3). No h-BN, or any other crystalline phase formation of BN, was observed when equimolar amounts KBH$_4$ and NaN$_3$ reacted at the same reaction conditions (sample 14), thus indicating that when all three chemical reagents are used single phase h-BN is produced in high yield.

TABLE 3

Effects of precursors on h-BN formation

| Sample | KBH$_4$ (mol) | NH$_4$Cl (mol) | NaN$_3$ (mol) | Reaction conditions | Yield (%) | Phase |
|---|---|---|---|---|---|---|
| 13 | 0.0412 | 0.0412 | None | 800° C. 48 hrs | 40% | r-BN, h-BN |
| 14 | 0.0412 | None | 0.0413 | 800° C. 48 hrs | None | No BN produced |

Reactions run at 500° C. using KBH$_4$, NH$_4$Cl and NaN$_3$ (samples 1-3) showed mixed-phase products of both r-BN and h-BN. When molar ratio of NaN$_3$ was increased by 1.5 fold and the reaction was run at 500° C. for 48 hours, there was little to no difference in mixed-phase formation of r-BN and h-BN.

Results and discussion

Morphologies and sizes of the BN nanosheet samples were investigated using TEM (Hitachi H-600). The range and average particle diameters of the nanosheets increased as the temperature and time were changed (Table 4). Desired sizes can be obtained by running a reaction at elevated temperatures for a shorter period or by lowering temperatures and doubling the reaction time. In addition, the morphology of the samples are also time and temperature dependent. At lower reaction temperatures and shorter reaction times, the morphology took on a triangular shape and then transformed into more hexagonal and irregular forms when reaction conditions increased up to 800° C. during 48 hour periods.

TABLE 4

Range and average particle diameters of BN nanosheets

| Sample | Reaction conditions | | Range of particle diameter (nm) | Average particle diameter (nm) |
|---|---|---|---|---|
| 1 | 500° C. | 12 hrs | 10-50 | 25 |
| 2 | | 24 hrs | 10-50 | 30 |
| 3 | | 48 hrs | 12-60 | 30 |
| 4 | 600° C. | 12 hrs | 12-200 | 70 |
| 5 | | 24 hrs | 60-400 | 200 |
| 6 | | 48 hrs | 250-500 | 400 |
| 7 | 700° C. | 12 hrs | 12-800 | 80 |
| 8 | | 24 hrs | 200-1000 | 300 |
| 9 | | 48 hrs | 250-1200 | 500 |
| 10 | 800° C. | 12 hrs | 250-900 | 600 |
| 11 | | 24 hrs | 200-1500 | 960 |
| 12 | | 48 hrs | 500-2000 | 1080 |

Due to structural similarities in h-BN and r-BN, XRD was needed to verify the lattice type for each sample. Each reaction sample (1-12) was indexed. The XRD patterns of samples 1-5, and 7 showed indexed spectra of mixed phases of r-BN and h-BN. Samples 6, 8 and 9 were predominantly h-BN and indexed XRD samples 10-12 (800° C. for 12-48 hrs) exhibited interplanar d-spacings and intensities that are indicative of h-BN crystallinity. Sample 10 exhibited indexed peaks that were in close agreement with the theoretical values for h-BN (JCPDS 34-0421). The lattice constants of a=2.508 and c=6.667 were calculated using the EdPCR component of FullProf Suite software.

Comparison of XRD data with the respective TEM image indicated the morphological triangle shapes present in the samples with mixed-phases of r-BN and h-BN. However, at higher temperatures, the XRD patterns indicated the presence of pure h-BN, while the TEM images show morphologies that are more hexagonal and irregularly shaped.

The UV-Visible spectroscopy (Lambda XLS+) was used to determine the UV absorption properties and the corresponding band gaps of all the BN samples. The UV-visible absorption spectrum of the BN samples are provided in FIG. 9. A very dilute and well dispersed ethanolic dispersion of BN nanosheet samples were scanned between 200 and 700 nm in a quartz cell. Table 5 shows the trend of increasing band gap as the purity of h-BN samples increase. The mixed-phases of r-BN and h-BN have smaller band gaps indicating that the r-BN nanostructures affect the optical band gap of the material. A sharp absorption band at 207 nm for sample 10 (FIG. 9a) reflects a band gap of 5.98 eV which is consistent with the value reported for a single crystal of pure h-BN. A slight blue shift was noticed for samples 11 (BNS24) and 12 (BNS48), which can be attributed to the increasing number of layers in the nanosheets.

TABLE 5

Band Gaps of BN nanosheet samples

| Sample | Band gap (eV) |
|---|---|
| 1 | 5.821 |
| 2 | 5.848 |
| 3 | 5.876 |
| 4 | 5.961 |
| 5 | 6.048 |
| 6 | 6.108 |
| 7 | 5.848 |
| 8 | 6.078 |
| 9 | 6.108 |
| 10 | 5.980 |
| 11 | 6.018 |
| 12 | 6.048 |

REFERENCES

A. Pakdel, X. Wang, C. Zhi, Y. Bando, K. Watanabe, T. Sekiguchi, T. Nakayamaab and D. Golberg, *Journal of Materials Chemistry*, 2012, 22, 4818.

Z. Liu, L. Song, S. Zhao, J. Huang, L. Ma, J. Zhang, J. Lou and P. M. Ajayan, *Nano Letters*, 2011, 11, 2032.

P. Sutter, R. Cortes, J. Lahiri, and E. Sutter, *Nano Letters*, 2012, 12, 4869.

K. H. Lee, H. J. Shin, J. Lee, I. Y. Lee, G. H. Kim, J. Y. Choi and S. W. Kim, *Nano Letters*, 2012, 12, 714.

C. R. Dean, A. F. Young, I. Meric, C. Lee, L. Wang, S. Sorgenfrei, K. Watanabe, T. Taniguchi, P. Kim, K. L. Shepard and J. Hone, *Nature Nanotechnology*, 2010, 5, 722.

W. Gannett, W. Regan, K. Watanabe, T. Taniguchi, M. F. Crommie and A. Zettl, *Applied Physics Letters*, 2011, 98, 242105 (1-3).

J. Taha-Tijerina, T. N. Narayanan, G. Gao, M. Rohde, D. A. Tsentalovich, M. Pasquali and P. M. Ajayan, *ACS Nano*, 2010, 6, 1214.

T. Li and Steve L. Hsu, *Journal of Physical Chemistry B*, 2010, 114, 6825.

J. Yu, L. Qin, Y. Hao, S. Kuang, X. Bai, Y. Chong, W. Zhang and E. Wang, *ACS Nano*, 2010, 4, 414.

K. Sato, H. Horibe, T. Shirai, Y. Hotta, H. Nakano, H. Nagai, K. Mitsuishi and K. Watari, *Journal of Materials Chemistry*, 2010, 20, 2749.

C. Harrison, S. Weaver, C. Bertelsen, E. Burgett, N. Hertel and E. Grulke, *Journal of Applied Polymer Science*, 2008, 109, 2529.

J. Wang, C. H. Lee and Y. K. Yap, *Nanoscale*, 2010, 2, 2028.

Y. Lin, T. V. Williams and J. W. Connell, *Journal of Physical Chemistry Letters*, 2010, 1, 277.

Y. Wang, Z. Shi and J. Yin, *Journal of Materials Chemistry*, 2011, 21, 11371.

Y. Xue, Q. Liu, G. He, K. Xu, L. Jiang, X. Hu and J. Hu, *Nanoscale Research Letters*, 2013, 8, 49.

G. Cao and Y. Wang, *Nanostructures & Nanomaterials Synthesis, Properties and Applications*. World Scientific Publishing Co, Singapore, Ed. 2, Chapter 1, PP 1-17.

A. Ismach, H. Chou, D. A. Ferrer, Y. Wu, S. McDonnell, H. C. Floresca, A. Covacevich, C. Pope, R. Piner, M. J. Kim, R. M. Wallace, L. Colombo and R. S. Ruoff, *ACS Nano*, 2012, 6, 6378.

L. X. Lin, Z. H. Li, Y. Zheng and A. S. Ahmed, *Nanotechnology*, 2011, 22, 215603.

A. Pakdel, X. Wang, Y. Bando and D. Golberg, *Acta Materialia*, 2013, 61, 1266.

R. S. Pease, *Acta Crystallographica*, 1952, 5, 356.

C. Souche, B. Jouferey, G. Hug and M. Nelhiebel, *Micron*, 1998, 29, 419.

R. Geick, C. H. Perry and G. Rupprecht, *Physical Reviews*, 1966, 146, 543.

S. Reich, A. C. Ferrari, R. Arenal, A. Loiseau, I. Bello and J. Robertson, *Physical Reviews B*, 2005, 71, 205201.

M. H. Li, L. Q. Xu, C. H. Sun, Z. C. Ju and Y. T. Qian, *Journal of Materials Chemistry*, 2009, 19, 8086.

K. Watanabe, T. Taniguchi and H. Kanda, *Nature Materials*, 2004, 3, 404.

Liang-xu Lin, Ying Zheng, Zhao-hui Li, Xiao-nv shen and Ke-mei Wei, *Solid State Sciences*, 2007, 9, 1099.

What is claimed is:

1. h-BN nanosheets,
wherein the h-BN nanosheets contain less than 0.1 atomic percent metal impurities and have a full width at half maximum (FWHM) of the X-ray powder diffraction pattern for a $d_{002}$ peak of at most 0.50 degrees,
the h-BN nanosheets have an aspect ratio of at least 10:1, and
the h-BN nanosheets are not nanofibers.

2. The h-BN nanosheets of claim 1, wherein the h-BN nanosheets are few layer h-BN nanosheets.

3. The h-BN nanosheets of claim 2, wherein the h-BN nanosheets have 6 to 20 layers of BN.

4. The h-BN nanosheets of claim 1, wherein the h-BN nanosheets do not contain r-BN, as determined by X-ray powder diffraction.

5. The h-BN nanosheets of claim 1, wherein the h-BN nanosheets have a full width at half maximum (FWHM) of the X-ray powder diffraction pattern for a $d_{002}$ peak of at most 0.30 degrees.

6. The h-BN nanosheets of claim 1, wherein the h-BN nanosheets have a full width at half maximum (FWHM) of the X-ray powder diffraction pattern for a $d_{100}$ peak of at most 0.50 degrees.

7. The h-BN nanosheets of claim 1, wherein the h-BN nanosheets have a full width at half maximum (FWHM) of the X-ray powder diffraction pattern for a $d_{100}$ peak of at most 0.25 degrees.

8. The h-BN nanosheets of claim 1, wherein the h-BN nanosheets have a particle size of 250 to 900 nm.

9. A capacitor, comprising:
(a) a substrate,
(b) a first conductive layer, on the substrate
(c) an insulating layer, on the conductive layer, and
(d) a second conductive layer, on the insulating layer,
wherein the insulating layer comprises the h-BN nanosheets of claim 1.

10. The capacitor of claim 9, wherein the h-BN nanosheets are few layer h-BN nanosheets.

11. The capacitor of claim 9, wherein the h-BN nanosheets have 6 to 20 layers of BN.

12. The capacitor of claim 9, wherein the h-BN nanosheets do not contain r-BN, as determined by X-ray powder diffraction.

13. The capacitor of claim 9, wherein the h-BN nanosheets have a full width at half maximum (FWHM) of the X-ray powder diffraction pattern for a $d_{002}$ peak of at most 0.30 degrees.

14. The capacitor of claim 9, wherein the h-BN nanosheets have a full width at half maximum (FWHM) of the X-ray powder diffraction pattern for a $d_{100}$ peak of at most 0.50 degrees.

15. The capacitor of claim 9, wherein the h-BN nanosheets have a full width at half maximum (FWHM) of the X-ray powder diffraction pattern for a $d_{100}$ peak of at most 0.25 degrees.

16. The h-BN nanosheets of claim 1,
wherein the h-BN nanosheets have 6 to 20 layers of BN,
the h-BN nanosheets do not contain r-BN, as determined by X-ray powder diffraction, and
the h-BN nanosheets have a particle size of 250 to 900 nm.

17. The h-BN nanosheets of claim 1,
wherein the h-BN nanosheets have 6 to 20 layers of BN, and
the h-BN nanosheets have a full width at half maximum (FWHM) of the X-ray powder diffraction pattern for a $d_{100}$ peak of at most 0.25 degrees.

18. The h-BN nanosheets of claim 1,
wherein the h-BN nanosheets have a full width at half maximum (FWHM) of the X-ray powder diffraction pattern for a $d_{002}$ peak of at most 0.30 degrees, and
the h-BN nanosheets have a full width at half maximum (FWHM) of the X-ray powder diffraction pattern for a $d_{100}$ peak of at most 0.25 degrees.

19. The capacitor of claim 9,
wherein the h-BN nanosheets have 6 to 20 layers of BN,
the h-BN nanosheets do not contain r-BN, as determined by X-ray powder diffraction, and
the h-BN nanosheets have a particle size of 250 to 900 nm.

20. The capacitor of claim 9,
wherein the h-BN nanosheets have 6 to 20 layers of BN, and
the h-BN nanosheets have a full width at half maximum (FWHM) of the X-ray powder diffraction pattern for a $d_{100}$ peak of at most 0.25 degrees.

* * * * *